(12) United States Patent
Peterson et al.

(10) Patent No.: US 10,680,640 B2
(45) Date of Patent: Jun. 9, 2020

(54) POWER-SAVING CURRENT-MODE DIGITAL-TO-ANALOG CONVERTER (DAC)

(71) Applicant: Cirrus Logic International Semiconductor Ltd., Edinburgh (GB)

(72) Inventors: Cory J. Peterson, Austin, TX (US); Anand Ilango, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 403 days.

(21) Appl. No.: 15/386,213

(22) Filed: Dec. 21, 2016

(65) Prior Publication Data
US 2018/0175879 A1    Jun. 21, 2018

(51) Int. Cl.
| H03M 1/66 | (2006.01) |
| H03M 3/00 | (2006.01) |
| H04R 3/00 | (2006.01) |
| H03M 1/10 | (2006.01) |
| H03M 1/00 | (2006.01) |
| H03M 1/74 | (2006.01) |
| H03M 1/68 | (2006.01) |

(52) U.S. Cl.
CPC ........... *H03M 3/504* (2013.01); *H03M 1/002* (2013.01); *H03M 1/1023* (2013.01); *H04R 3/007* (2013.01); *H03M 1/68* (2013.01); *H03M 1/742* (2013.01)

(58) Field of Classification Search
CPC ..... H03M 3/504; H03M 1/002; H03M 1/1023
USPC .......................................................... 341/144
See application file for complete search history.

(56) References Cited

U.S. PATENT DOCUMENTS

| 6,650,265 B1* | 11/2003 | Bugeja | H03M 1/002 |
| | | | 341/131 |
| 9,484,947 B1* | 11/2016 | Nguyen | H03M 1/70 |
| 9,680,488 B2* | 6/2017 | Das | H03M 1/66 |
| 2005/0105507 A1* | 5/2005 | Clements | H03K 17/163 |
| | | | 370/351 |
| 2008/0238717 A1 | 10/2008 | Short et al. | |
| 2011/0025540 A1 | 2/2011 | Katsis et al. | |
| 2015/0171878 A1* | 6/2015 | Schafferer | H03M 1/74 |
| | | | 375/297 |
| 2018/0145697 A1* | 5/2018 | Crespi | G06F 3/165 |

FOREIGN PATENT DOCUMENTS

WO    2015/041880 A1    3/2015

* cited by examiner

*Primary Examiner* — Peguy Jean Pierre
(74) *Attorney, Agent, or Firm* — Norton Rose Fulbright US LLP (57) ABSTRACT

A digital-to-analog converter (DAC) for an audio system in a media device, such as a portable media device or smart phone, may be operated to turn off portions of the DAC to reduce power consumption. Segments of a segment-able DAC may be powered off when the output level of the DAC is lower than the full scale output of the DAC. For example, DAC elements within a finite impulse response (FIR) DAC may be turned off when a desired output level can be obtained with less than all DAC elements of the FIR DAC.

30 Claims, 10 Drawing Sheets

POWER-SAVING CURRENT-MODE DIGITAL-TO-ANALOG CONVERTER (DAC)

FIELD OF THE DISCLOSURE

The instant disclosure relates to digital-to-analog conversion. More specifically, portions of this disclosure relate to reducing power consumption in digital-to-analog conversion.

BACKGROUND

Power consumption within mobile devices is a continuing challenge. As mobile devices decrease in size, the battery also decreases in size to further limit the available runtime of the mobile device. Demand on functionality of the mobile devices is also continuing to increase, and that additional functionality often comes at the cost of increased power consumption, which again reduces the available run time of the mobile device. In particular, performance of audio systems in mobile devices are increasing to allow for playback of high-fidelity music and high-definition voice telephone calls. Higher performance audio requires higher performance digital-to-analog converters (DACs). DACs that produce the analog audio output for a speaker or headphones from digital audio files. Further, some higher quality headphones and speakers have larger impedances, and thus require larger output voltages from the DACs, which further increases power consumption.

Shortcomings mentioned here are only representative and are included simply to highlight that a need exists for improved electrical components, particularly for audio systems employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above. For example, reduced power consumption may benefit other audio systems, such as home stereo systems.

SUMMARY

A current-mode digital-to-analog converter (IDAC) may include an array of current source elements controlled by a digital signal to generate an analog signal corresponding to the digital signal. The DAC may include multiple DAC segments, each of which can be individually powered up or powered down based on the digital signal. When the digital signal indicates an increasing amplitude, DAC segments may be powered up as necessary to generate an analog signal that corresponds to the digital signal. When the digital signal indicates a decreasing amplitude, DAC segments may be powered off to reduce power consumption when the remaining DAC segments are sufficient to generate the analog signal corresponding to the digital signal. In one example, one or more DAC segments may be powered off to reduce power consumption when the amplitude of the analog signal decreases below a threshold level. Thus, a power output of the DAC may be dynamically controlled during playback of media. The decisions regarding powering up and powering off DAC segments may be based, in part or in whole, on a transient envelope of audio contained in the input digital signal. A transient envelope may be defined as an envelope in a moving window of a pre-determined length. This differentiates between an envelope of an entire signal since playback began from a transient envelope corresponding to a moving window during the playback. One technique for powering off DAC segments is sending dump codes to the DAC segments. Another technique for powering off DAC segments is sending zero codes to the DAC segments.

Electronic devices incorporating the digital-to-analog converters (DACs) described above may benefit from reduced power consumption in components of integrated circuits in the electronic devices. Integrated circuits of the electronic device may include a digital-to-analog converter (DAC). The DAC may be used to convert a digital signal, such as a music file stored in memory or on a disc, to an analog representation of the digital signal. That analog signal may be amplified and output to a speaker, headphones, or other transducer. Such a DAC, or a similar analog-to-digital converter (ADC), may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like.

According to one embodiment, a method of operating a finite impulse response (FIR) current-mode digital-to-analog converter (DAC) with two or more DAC segments may include steps that perform functions including determining a first portion of the two or more DAC segments sufficient to generate an output signal based, at least in part, on an envelope of an input signal and powering down a second portion of the two or more DAC segments not in the first portion of the two or more DAC segments. DAC segments may be powered off by performing steps such as switching off a cascade switch or switching off a mirror switch.

According to another embodiment, a finite impulse response (FIR) digital-to-analog converter (DAC) may include two or more DAC segments and a controller coupled to the two or more DAC segments and configured to perform steps including determining a first portion of the two or more DAC segments sufficient to generate an output signal based, at least in part, on an envelope of an input signal and powering down a second portion of the two or more DAC segments not in the first portion of the two or more DAC segments.

According to yet another embodiment, an audio processing system may include an input node configured to receive a digital audio signal; a finite impulse response (FIR) digital-to-analog converter (DAC) comprising two or more DAC segments configured to convert the digital audio signal to an analog audio signal; an amplifier coupled to an output of the FIR DAC and configured to amplify the analog audio signal to produce an amplified analog audio signal; an output node configured to output the amplified analog audio signal to drive a transducer; and an audio controller coupled to the FIR DAC. The controller may be configured to perform functions including determining a first portion of the two or more DAC segments sufficient to generate an output signal based, at least in part, on an envelope of an input signal and powering down a second portion of the two or more DAC segments not in the first portion of the two or more DAC segments.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
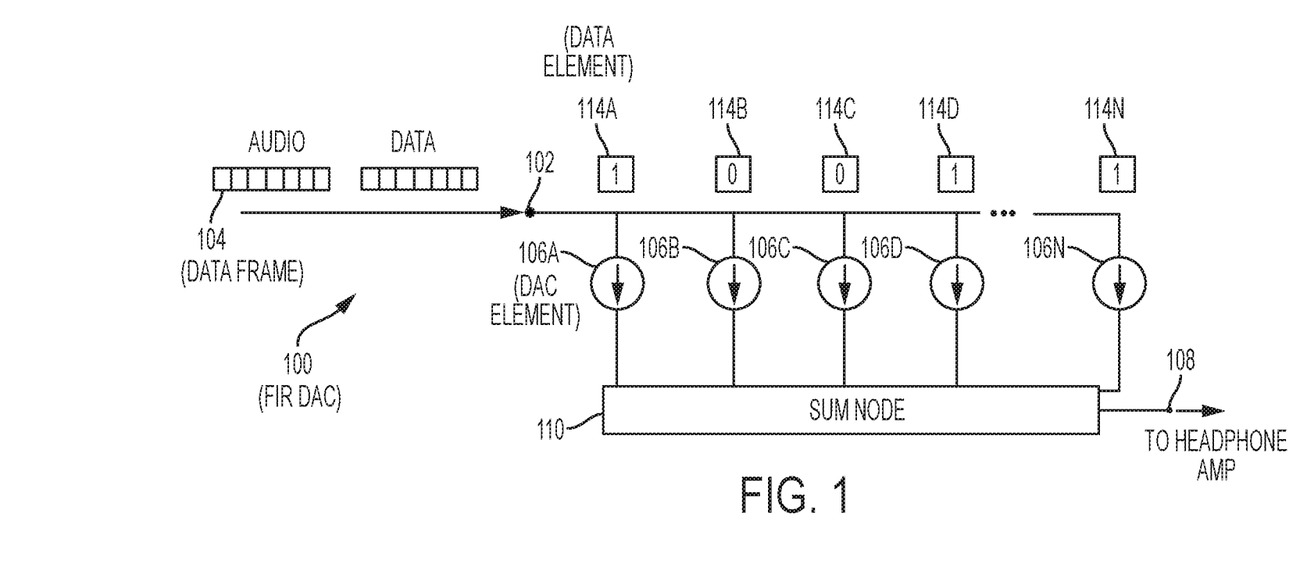
FIG. 1 is a block diagram illustrating a finite impulse response (FIR) digital-to-analog converter (DAC) according to some embodiments of the disclosure.

One digital-to-analog converter (DAC) configuration suitable for controlling power consumption is a finite impulse response (FIR) digital-to-analog converter (DAC), although other segment-able DACs may also benefit from aspects of this disclosure. FIG. 1 is a block diagram illustrating a finite impulse response (FIR) digital-to-analog converter (DAC) according to some embodiments of the disclosure. A FIR DAC 100 may receive audio data at input node 102, which may be formatted as data frames 104. The data frames 104 control a plurality of DAC elements 106A-N. The output of the DAC elements 106A-N are summed in summation node 110. The summation node 110 outputs a value to output node 108 that is an analog signal representative of the input digital signal to input node 102. The output node 108 may couple to other components, such as a headphone amplifier for driving the analog signal to a pair of headphones. The plurality of DAC elements 106A-N may receive, for example, a data element 114A-N from the data frame 104 that turns on or off each of the DAC elements 106A-N. The amplitude of the output signal at the output node 108 increases as DAC elements 106A-N are turned on, and decreases as DAC elements 106A-N are turned off.

The DAC elements 106A-N may consume power whether receiving a zero or a one bit. That is, the DAC elements 106A-N may consume power even when not contributing to the output signal at output node 108. Although the DAC elements 106A-N are not contributing current to the sum node 110, the DAC elements 106A-N are usually dumping current to ground. Thus, power is consumed when the DAC elements 106A-N receive a zero or one bit. When a low amplitude signal is present, such as for low volume portions of music files, some of the DAC elements 106A-N may be powered off to reduce this wasted power. In one example configuration, the DAC elements 106A-N may be grouped into DAC segments, and those DAC segments powered on or powered off based on a desired amplitude level of an output analog signal. A FIR DAC with multiple DAC segments is shown in FIG. 2.

Figure 2:
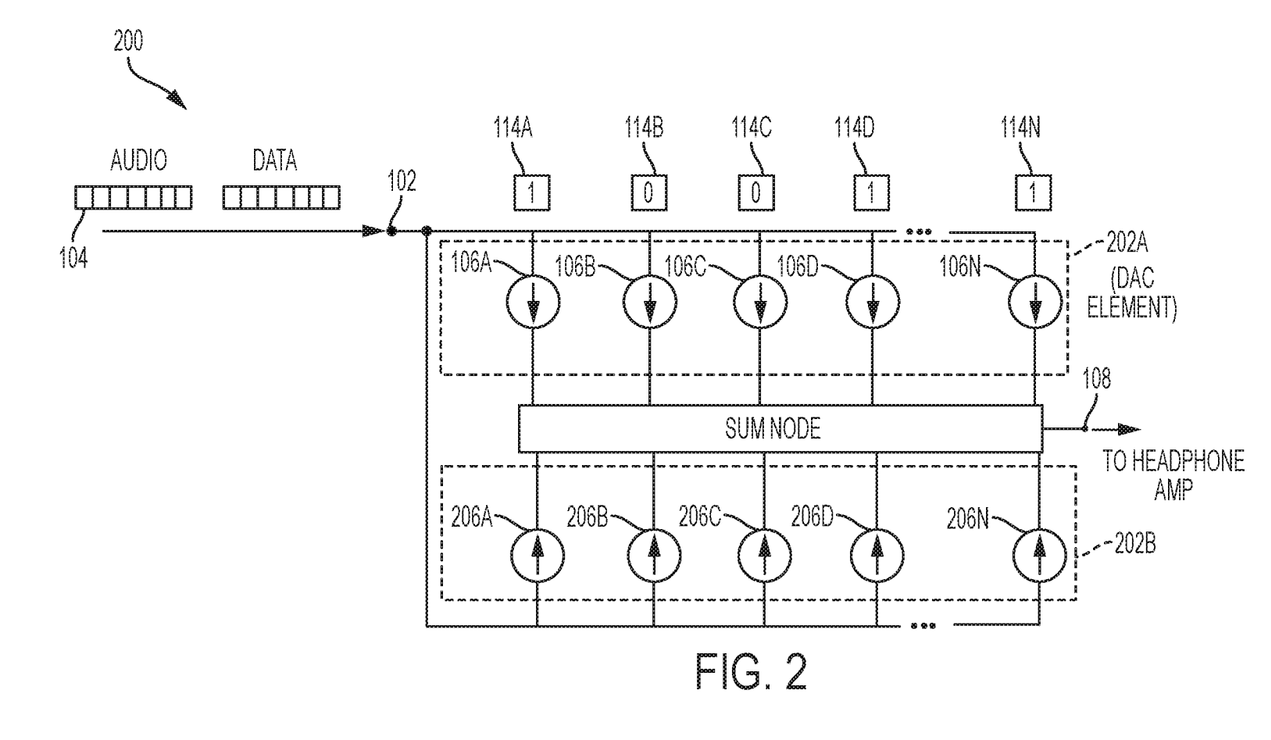
FIG. 2 is a block diagram illustrating a finite impulse response (FIR) digital-to-analog converter (DAC) with multiple DAC segments according to some embodiments of the disclosure.

FIG. 2 is a block diagram illustrating a finite impulse response (FIR) digital-to-analog converter (DAC) with multiple DAC segments according to some embodiments of the disclosure. A FIR DAC 200 may include DAC segment 202A and DAC segment 202B. Although only two DAC segments are shown, additional DAC segments may be implemented in a FIR DAC. A DAC segment 202A may include current source elements 106A-106N. A DAC segment 202B may include current source elements 206A-N. The digital audio data received at input node 102 is converted to an analog signal at output node 108. There may be multiple combinations of DAC elements 106A-N and 206A-N that may be used to generate the output. However, certain combinations may allow for power-saving features to be implemented in the FIR DAC 200. Examples of different combinations for achieving the same output are shown in FIG. 3A and FIG. 3B.

Figures 3A, 3B, 4:
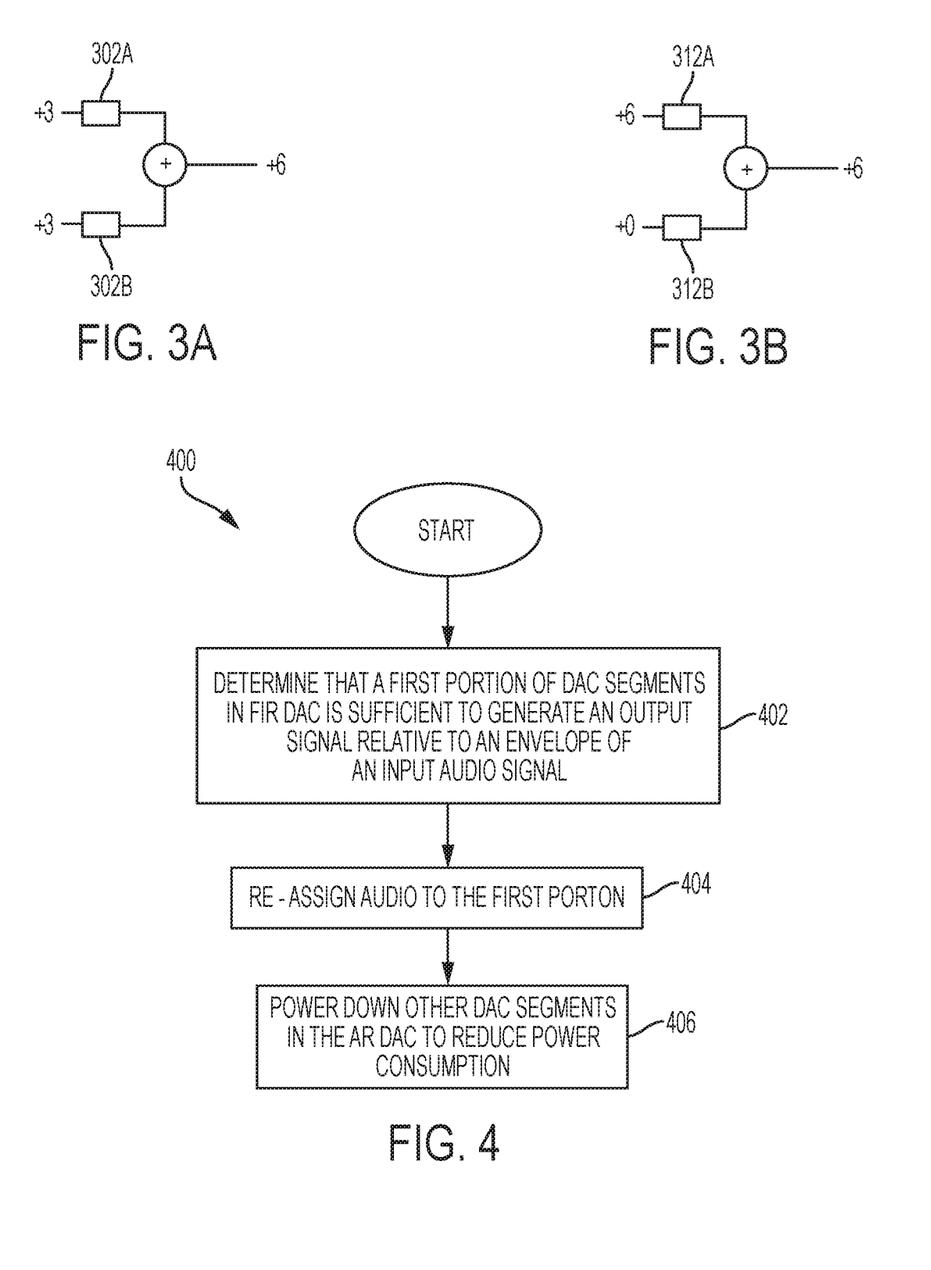
FIG. 3A is a block diagram illustrating one configuration for generating an analog output with multiple DAC segments of a FIR DAC according to some embodiments of the disclosure.
FIG. 3B is a block diagram illustrating one configuration for generating an analog output with multiple DAC segments of a FIR DAC according to some embodiments of the disclosure.
FIG. 4 is a flow chart illustrating an example method for powering off DAC segments of a FIR DAC according to some embodiments of the disclosure.

FIG. 3A is a block diagram illustrating one configuration for generating an analog output with multiple DAC segments of a FIR DAC according to some embodiments of the disclosure. An example input digital data may correspond to an output analog amplitude of +6. Two DAC segments 302A, 302B may be assigned values of +3 and +3, respectively. The DAC segments 302A, 302B generate the assigned values to obtain the desired output value of +6. However, other combinations of outputs from the DAC segments 302A and 302B can produce the same desired output value of +6. Another example is shown in FIG. 3B. FIG. 3B is a block diagram illustrating one configuration for generating an analog output with multiple DAC segments of a FIR DAC according to some embodiments of the disclosure. Two DAC segments 312A, 312B may be assigned values of +6 and 0, respectively. The DAC segments 312A and 312B generate the assigned values to obtain the desired output value of +6. In the configuration of FIG. 3B, the DAC segment 312B is not contributed to the output. Thus, the DAC segment 312B can be powered off to reduce power consumption. The DAC configurations described with reference to FIG. 1 and FIG. 2 allow control of individual DAC elements or DAC segments to generate a desired output. The DAC elements or DAC segments may thus be controlled to allow powering off of certain DAC elements or DAC segments to reduce power consumption. A controller coupled to the DAC elements may be programmed to control the DAC elements in such a manner. One example method of operation for such a controller is described with reference to FIG. 4.

FIG. 4 is a flow chart illustrating an example method for turning off DAC segments of a FIR DAC according to some embodiments of the disclosure. A flow chart 400 may begin at block 402 with determining that a first portion of DAC segments in a FIR DAC is sufficient to generate an output signal relative to an envelope of an input audio signal. Block 402 may include a controller receiving an input audio signal, decoding the digital data of the input audio signal, determining an envelope of that input audio signal, and determining that the output capable from a first portion of DAC segments is sufficient to generate an analog signal corresponding to the decoded digital data. The first portion of DAC segments may be one DAC segment, as with the DAC segment 312A of the example of FIG. 3B. The first portion of DAC segments may also be more than one DAC segment, but less than the total number of available DAC segments. For example, when a FIR DAC includes 5 DAC segments, the first portion of DAC segments may be any number from 1-4 DAC segments. Then, at block 404, audio output may be assigned to the determined first portion of DAC segments. Referring to the example of FIG. 3B, block 404 includes the step of assigning +6 to the DAC segment 312A. That is, the first portion of DAC segments determined in block 402 is made responsible for generating the desired output value at block 404. Next, at block 406, other DAC segments of the FIR DAC may be powered off to reduce power consumption. Referring to the example of FIG. 3B, the DAC segment 312B may be powered off because it is not contributing to the desired output value.

Figure 5:
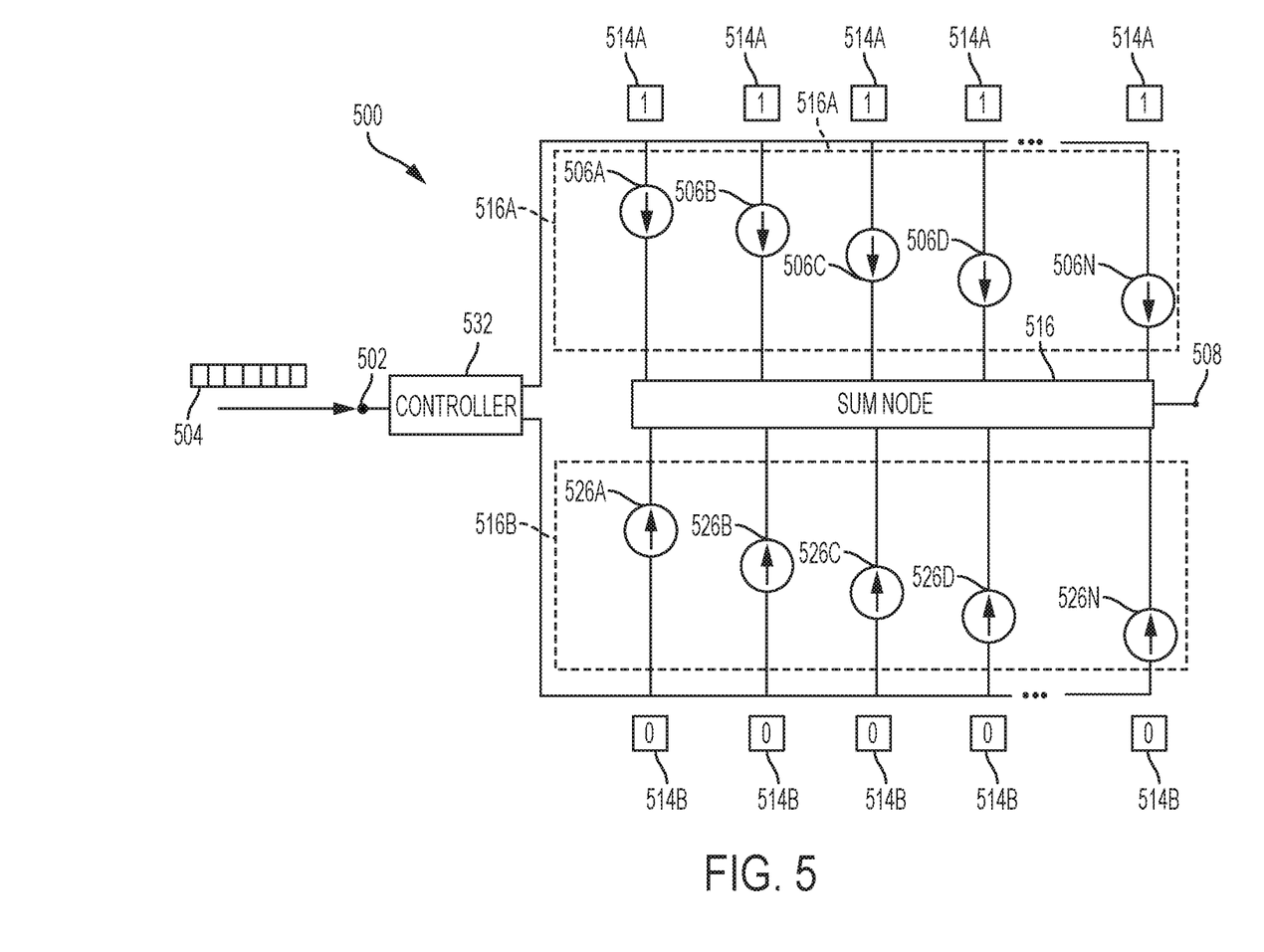
FIG. 5 is a block diagram illustrating a controller for individually controlling DAC segments of a FIR DAC according to some embodiments of the disclosure.

A FIR DAC with a controller that can be configured to power off portions of the FIR DAC (e.g., DAC elements or DAC segments) in accordance with the example of FIG. 4 is described with reference to FIG. 5. FIG. 5 is a block diagram illustrating a controller for individually controlling DAC segments of a FIR DAC according to some embodiments of the disclosure. A FIR DAC 500 may include a controller 532 configured to receive input data frames 504 at input node 502. The input data frames 504 may include a digital representation of audio sounds to be converted to an analog signal for reproducing the audio sounds at a transducer. The controller 532 may control DAC segments 516A, 516B to generate an output at output node 508 corresponding to the received input data frame 504. For example, the controller 532 may control the DAC segments 516A, 516B such that the sum of DAC elements 506A-N and 526A-N produced by summation node (SUM NODE) 516 is an analog version of the received audio data. The controller 532 may control DAC segments 516A, 516B by producing control data 514A and 514B that is input to the DAC elements 506A-N and 516A-N. In one example, the controller 532 may transmit zeros to all DAC elements 526A-N of DAC segment 516B to power off DAC segment 516B. The desired output value for output node 508 may then be produced from the DAC elements 506A-N. The controller 532 may also or alternatively have control over individual DAC elements 506A-N and 526A-N, such as control over a mirror and/or cascode switch within the DAC elements 506A-N and 526A-N. In another configuration, the controller 532 may have control over all mirror and/or cascode switches of DAC elements 506A-N and 526A-N as a group.

Figure 6:
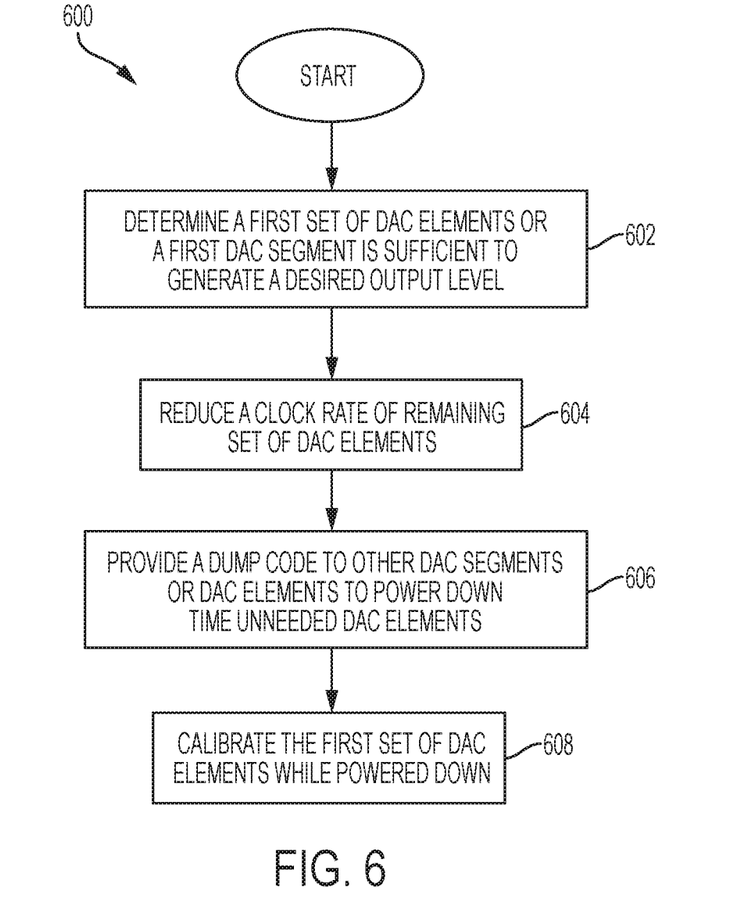
FIG. 6 is a flow chart illustrating an example method for powering off DAC segments using dump codes according to some embodiments of the disclosure.

One method for powering off a DAC segment is to transmit dump codes to the DAC segment. An example operation of this method is described with reference to FIG. 6. FIG. 6 is a flow chart illustrating an example method for powering off DAC segments using dump codes according to some embodiments of the disclosure. A method 600 may begin at block 602 with determining a first set of DAC elements or a first portion of DAC segments that are sufficient to generate a desired output level. Fewer than all DAC elements or DAC segments may be sufficient to generate an output signal for the audio data, such as when the audio being played back is quiet or turned to a low volume. At block 604, a clock rate of the remaining set of DAC elements or remaining DAC segments may be reduced, such as by integer fraction. The reduction in clock rate may be optionally performed to reduce capacitive coupling during the transition of the remaining set of DAC elements and/or DAC segments to a powered off state. At block 606, a dump code is provided to the remaining set of DAC elements and/or DAC segments to stop the DAC elements and/or DAC segments from contributing to the output node. The dump code instructs DAC elements to connect both positive and negative drive currents to ground and dump the current, rather than direct the current to the output node. The dump code causes shunting output to ground from switch elements of the remaining set of DAC elements in response to the dump code. The dump code may be recognized, and after a DAC element is in the dump configuration, the DAC element may be powered off. While in the powered down state, one or more of the powered down DAC elements may optionally be calibrated at block 608. The calibration at block 608 may be performed for individual or groups of DAC elements that are powered down. The selection of individual or groups of DAC elements may cycle through all of the DAC elements over a listening period, such that each of the DAC elements may receive calibration.

The powering off of multiple DAC elements at the same time may cause problems due to capacitive coupling with the DAC elements being powered off. These problems may be reduced by powering off the unused DAC elements in groups, rather than all at the same time. For example, referring to FIG. 5, if DAC segment 516B is being powered off, then a first group of DAC elements 526A, 526B may be powered off, followed by a second group of the DAC elements 526C and 526D, and then followed by a third group of the DAC elements 526E-N. The controller 532 may perform steps for turning off DAC elements according to such a method, such as by staggering the switching off of cascode switches in each of the DAC elements 526A-N.

The powering down of some DAC elements may also cause problems with offset calibration. When some of the DAC elements are powered off, any offset from the powered on DAC elements may begin to appear at the output node. This offset problem may be reduced by providing a step input on a modulator opposite to the calibrated offset of the DAC elements being powered off. When the powered on DAC elements and powered off DAC elements are clocked at approximately the same rate, the change at the modulator will propagate through the DAC elements equally.

Figure 7:
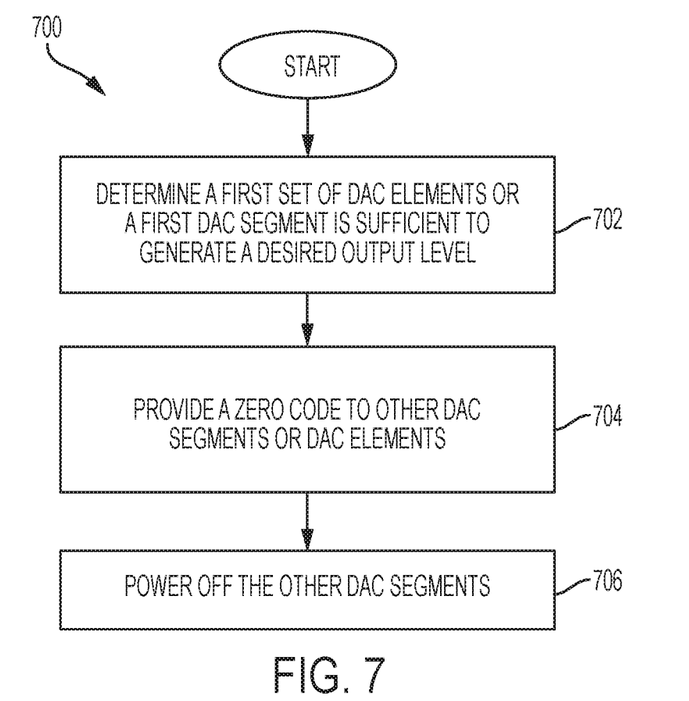
FIG. 7 is a flow chart illustrating an example method for powering off DAC segments using zero codes according to some embodiments of the disclosure.

One method for powering off a DAC segment is to transmit zero codes to the DAC segment. An example operation of this method is described with reference to FIG. 7. FIG. 7 is a flow chart illustrating an example method for powering off DAC segments using zero codes according to some embodiments of the disclosure. A method 700 may begin at block 702 with determining a first set of DAC elements or a first set of DAC segments are sufficient to generate the converted analog signal. At block 704, a zero code may be provided to the remaining DAC elements not needed to generate the desired output level. The zero code may cause the DAC elements to modulate between ground and an output node such that an average output from that DAC element is zero. This zero code may be an alternating zero pattern output by the controller to each of the unused DAC elements. At block 706, the remaining unused DAC elements may then be powered off, such as by turning off cascode switches in the DAC elements. In some embodiments, DAC elements may be switched off in groups to reduce glitches at the output node.

Figure 8:
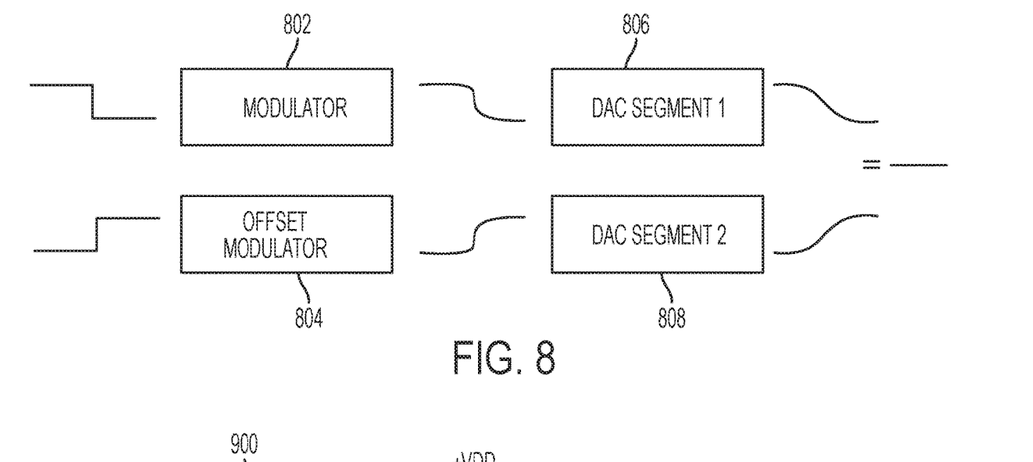
FIG. 8 is a block diagram illustrating a FIR DAC output with zero codes sent to some DAC segments according to one embodiment of the disclosure.

If an offset would arise or does arise as a result of zeroing out the unused DAC elements, a calibrated inverse offset pattern can instead be output by the controller to the unused DAC elements to allow the output offset to be calibrated out. In one configuration implementing such offset reduction, a step may be added to a modulator input equal to an offset of a DAC element, such that the remaining DAC elements will then be able to reproduce the offset of the powered off DAC element. One example operation of the offset reduction is shown in FIG. 8. FIG. 8 is a block diagram illustrating a FIR DAC output with zero codes sent to some DAC segments according to one embodiment of the disclosure. A modulator 802 may drive a first DAC segment 806; an offset modulator 804 may drive a second DAC segment 808. The offset modulator 804 may drive the second DAC segment 808 with an input that results in the output of the second DAC segment 808 cancelling offset from the first DAC segment 806. The modulator 802 and the offset modulator 804 may be driven with opposite step responses to achieve the offset reduction or cancellation. The offset modulator 804 and second DAC segment 808 may be powered off after the first DAC segment 806 is recalibrated to reduce offset. In some embodiments, the modulator 802 may have a higher bit width than the offset modulator 804.

Figure 9:
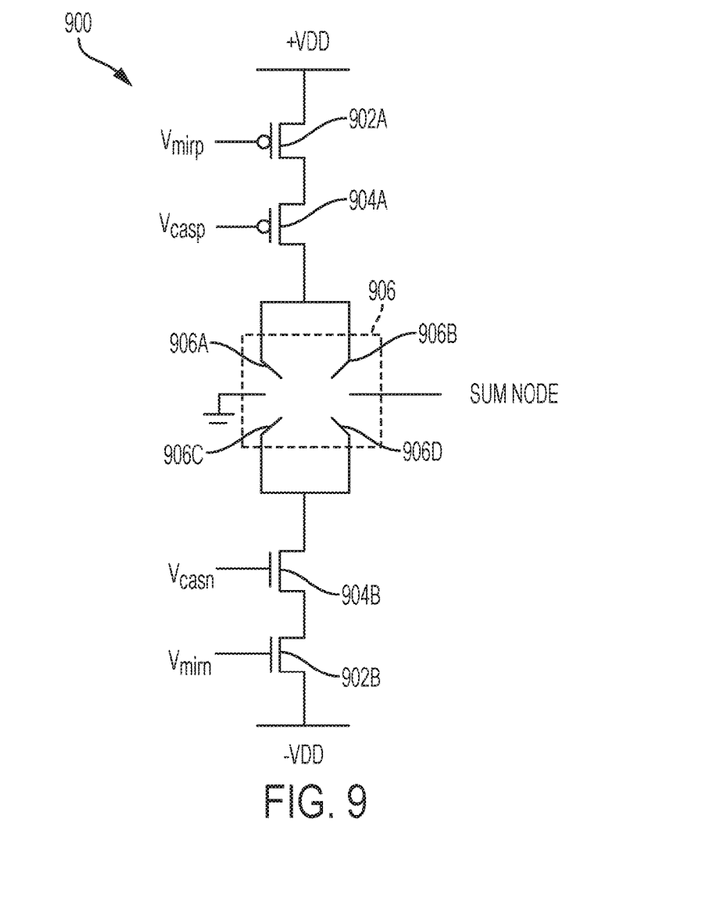
FIG. 9 is a circuit diagram illustrating an element of a FIR DAC according to some embodiments of the disclosure.

One example DAC element of a FIR DAC is shown in FIG. 9. FIG. 9 is a circuit diagram illustrating an element of a FIR DAC according to some embodiments of the disclosure. A DAC element 900 may include switches 906 configured to couple a positive power supply $+V_{DD}$ and a negative power supply $-V_{DD}$ to ground or a summation node. For example, a switch 906A may couple positive supply to ground, a switch 906B may couple the positive supply to the summation node, a switch 906C may couple the negative supply to ground, and a switch 906D may couple the negative supply to the summation node. The positive and negative supply may be separated from the switches 906 by mirror switches 902A and 902B, respectively, and cascode switches 904A and 904B, respectively. Either or both of the cascode switches 904A-B and the mirror switches 902A-B may be switched off to power off the DAC element 900 and reduce power consumption caused by the DAC element 900.

Figure 10:
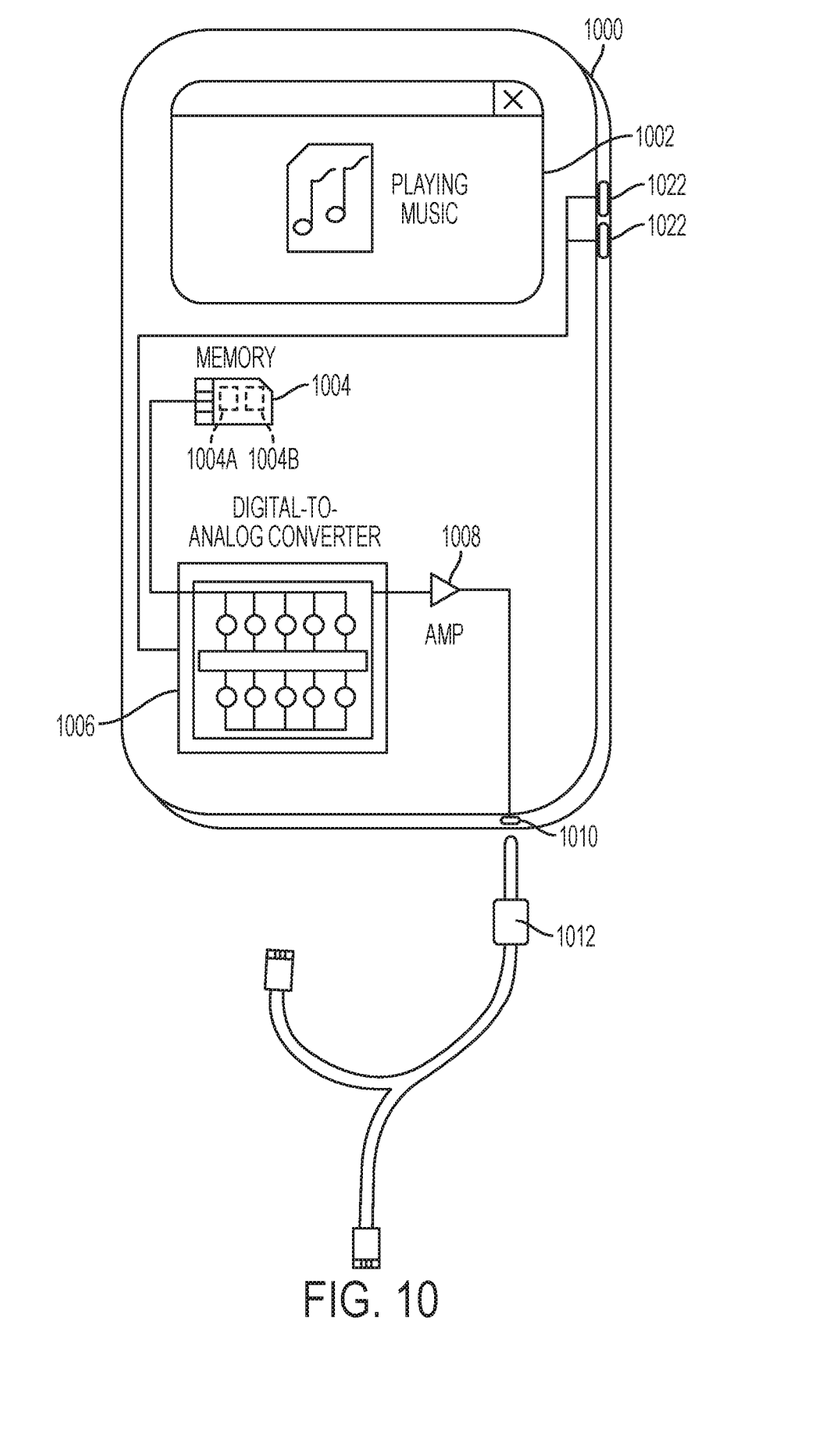
FIG. 10 is an example personal media device configured to playback audio using a digital-to-analog converter (DAC) having control over DAC segments according to some embodiments of the disclosure.

One example of an electronic device incorporating the power-saving DAC techniques and systems described herein is shown in FIG. 10. FIG. 10 is an example personal media device configured to playback audio using a digital-to-analog converter (DAC) having control over DAC segments according to some embodiments of the disclosure. A personal media device 1000 may include a display 1002 for allowing a user to select from music files for playback, which may include both high-fidelity music files and standard-quality music files. When high-fidelity music files are selected by a user, audio files may be retrieved from memory 1004A-B by an application processor (not shown) and provided to a digital-to-analog converter (DAC) 1006. When normal quality music files are selected by a user, audio files may be retrieved from memory 1004B and provided to the DAC 1006 or a different DAC. The audio data stream may be provided to the DAC 1006 according to, for example, a PCM encoding, DSD encoding, or a DoP encoding (DSD over PCM). The DAC 1006 may be a FIR DAC, similar to those described in the embodiments of FIG. 1, FIG. 2, FIG. 5, FIG. 8, and FIG. 9. The DAC 1006, or other circuitry in the device 1000, may perform methods similar to those described in the embodiments of FIG. 3A, FIG. 3B, FIG. 4, FIG. 6, and FIG. 7. The digital data retrieved from memory 1004A-B may be converted to analog signals by the DAC 1006, and those analog signals amplified by an amplifier 1008. The amplifier 1008 may be coupled to an audio output 1010, such as a headphone jack, for driving a transducer, such as headphones 1012, or a microspeaker (not shown) integrated with the personal media device 1000. Although the data received at the DAC 1006 is described as received from memory 1004A-B, the audio data may also be received from other sources, such as a USB connection, a device connected through Wi-Fi to the personal media device 1000, a cellular radio, an Internet-based server, another wireless radio, and/or another wired connection.

Figure 11:
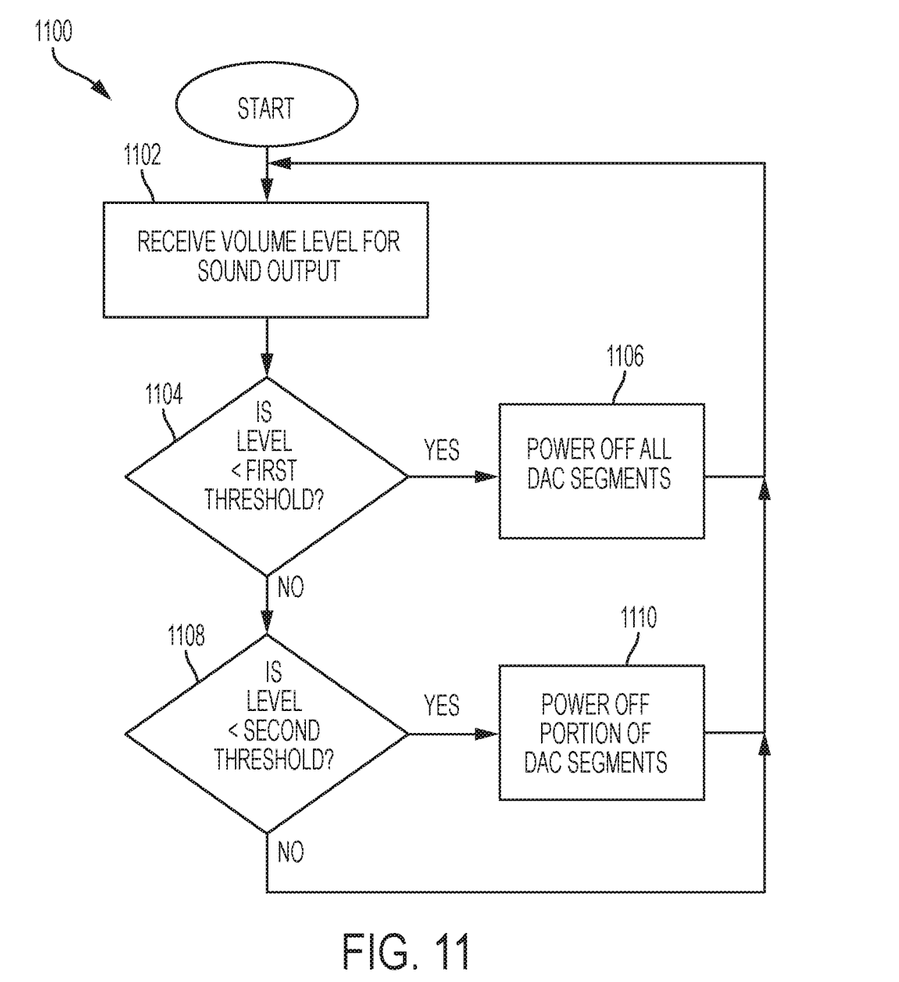
FIG. 11 is a flow chart illustrating an example method for powering on and off DAC segments based on a volume level according to some embodiments of the disclosure.

A set volume for the playback of audio may be used to power off some DAC segments and/or DAC elements in a FIR DAC. For example, a volume level set by a user on a personal media device through, for example, a touch screen input or a physical volume button input, may be used as a basis to power off some DAC segments and/or DAC elements. A method for controlling a FIR DAC based on volume level is shown in FIG. 11. FIG. 11 is a flow chart illustrating an example method for powering on and off DAC segments based on a volume level according to some embodiments of the disclosure. A method may begin at block 1102 with receiving a volume level for sound output. The volume level may be received by the controller within the DAC, such as controller 532 of FIG. 5. At block 1104, it may be determined whether the volume level is greater than a first threshold level. The first threshold level may be a level below which no audible sounds can be perceived by a human. An example first threshold level below audible perception is 130 dB. If so, the method 1100 continues to block 1106 to power off all DAC segments. All DAC segments may be powered off at block 1106 because with no perceptible sound reproduction, there is no need for DAC to operate. If the volume level is above the first threshold level, then the method 1100 continues to block 1108 to determine if the volume level is below a second threshold level. The second threshold level may be a level below which the full scale of the DAC is not required, such that the desired sound output level may be achieved with less than all DAC segments or DAC elements. If the volume level is below the second threshold, then, at block 1110, audio may be assigned to some of the DAC segments and/or DAC elements and the unused portions of the DAC segments and/or DAC elements may be powered off. In some embodiments, volume control may be performed by setting certain DAC elements to zero, such that the DAC elements do not contribute to the summation node. Additional examples related to such volume control are described in U.S. patent application Ser. No. 15/192,258 filed Jun. 24, 2016, and entitled "Digital Volume Control," which is hereby incorporated by reference. When volume control is achieved by setting certain DAC elements to zero, those DAC elements set to zero may be powered off to reduce power consumption. Although FIG. 11 describes operation based on a received volume level, the operation of determining DAC segments for powering off may be based on other criteria, such as sound level of the input audio signal, sound level of an adaptive noise cancellation signal, etc. Furthermore, although FIG. 11 describes operation based on two threshold levels, additional threshold levels may be used to trigger the powering off of different numbers of DAC segments and/or DAC elements.

Figure 12:
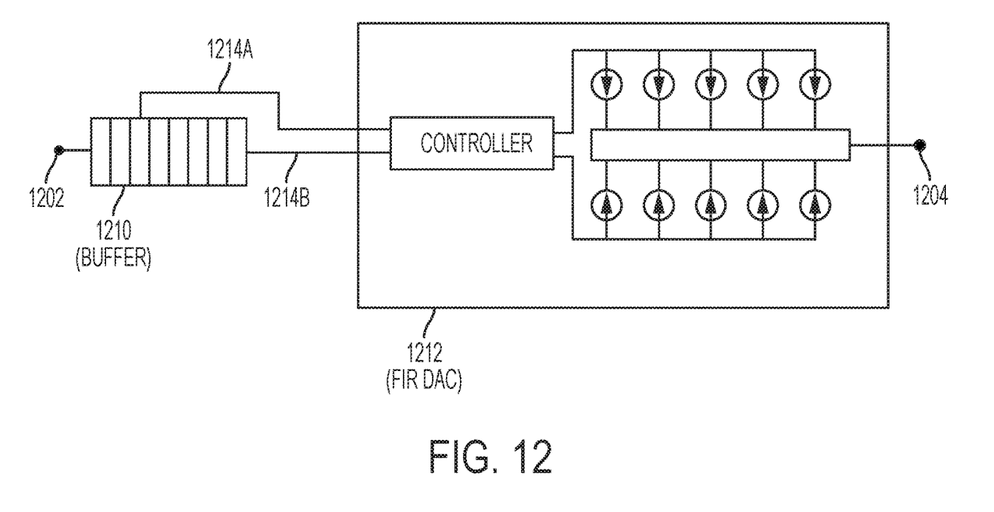
FIG. 12 is a block diagram illustrating an example implementation for buffering of data for a DAC according to some embodiments of the disclosure.

Buffering may be used to provide data regarding sound levels in advance of the data receiving the DAC. This may allow the DAC to begin compensating in advance of rapid changes in sound level of audio being played back. One example configuration for buffering is shown in FIG. 12. FIG. 12 is a block diagram illustrating an example implementation for buffering of data for a DAC according to some embodiments of the disclosure. An input node 1202 may receive input data, such as digital high-fidelity audio data from a local memory. The received input data may be stored in buffer 1210, and provided to a FIR DAC 1212 from the buffer 1210. The buffer 1210 may be a first-in-first-out (FIFO) buffer. Two outputs may be provided from the buffer 1210 to the FIR DAC 1212. An output 1214B may provide a delayed version of the received data. An output 1214A may provide a less-delayed or real-time version of the received data. The FIR DAC 1212 may use information received from output 1214A and 1214B to configure the DAC segments and/or DAC elements, such as by determining which DAC segments and/or which DAC elements to power on or power off. This determination may be performed in advance of the data arriving at the FIR DAC 1212 through output 1214B. The FIR DAC 1212 may use data from the output 1214B for producing an analog signal at output node 1204. That is, the digital data of output 1214B may be converted to an analog signal at output node 1204. The conversion of output 1214B may be performed based on a configuration of the FIR DAC 1212 set in accordance with the earlier version of the data received from output 1214A. Buffering as described with reference to FIG. 12 may be implemented in a Class H amplifier.

The schematic flow chart diagrams of FIG. 4, FIG. 6, FIG. 7, and FIG. 11 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller or other modules or circuitry may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general purpose processor capable of executing instructions contained in software. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although digital-to-analog converters (DACs) are described throughout the detailed description, aspects of the invention may be applied to the design of other converters, such as analog-to-digital converters (ADCs) and digital-to-digital converters, or other circuitry and components based on delta-sigma modulation. As another example, although digital signal processors (DSPs) or audio controllers are described throughout the detailed description, aspects of the invention may be applied to the design of other processors, such as graphics processing units (GPUs) and central processing units (CPUs). Further, although ones (1s) and zeros (0s) or highs and lows are given as example bit values throughout the description, the function of ones and zeros may be reversed without change in operation of the processor described in embodiments above. As another example, although processing of audio data is described, other data may be processed through the filters and other circuitry described above. As a further example, although FIR DACs are described in examples herein, the power saving techniques described herein may be applied to other DACs with segment-able elements. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method of operating a finite impulse response (FIR) digital-to-analog converter (DAC) with two or more DAC segments, comprising:
   buffering the input signal to obtain a buffered input signal;
   determining a first portion of the two or more DAC segments sufficient to generate an output signal based, at least in part, on an envelope of the buffered input signal; and
   powering off a second portion of the two or more DAC segments not in the first portion of the two or more DAC segments.

2. The method of claim 1, further comprising:
   powering on the second portion of the two or more DAC segments; and
   repeating the steps of determining the first portion and powering off the second portion, wherein the repeating of the steps of determining the first portion and powering off the second portion dynamically controls a power output of the FIR DAC during playback of media.

3. The method of claim 1, wherein the step of determining the first portion of the two or more DAC segments is based, at least in part, on a transient envelope of the buffered input signal.

4. The method of claim 1, wherein the step of powering off the second portion of the two or more DAC segments comprises:
   powering off a first fraction of a plurality of elements within the second portion of the two or more DAC segments; and
   powering off a second fraction of the plurality of elements within the second portion of the two or more DAC segments after powering off the first fraction.

5. The method of claim 1, wherein the step of powering off the second portion of the two or more DAC segments comprises providing a dump code to the second portion of the two or more DAC segments.

6. The method of claim 5, wherein the step of powering off the second portion of the two or more DAC segments comprises:
   shunting output to ground from switch elements of the second portion of the two or more DAC segments in response to the dump code; and
   disconnecting a power supply from the switch elements shunted to ground.

7. The method of claim 6, wherein the step of powering down the second portion of the two or more DAC segments comprises:
   reducing a clock rate of at least some switch elements of the second portion of the two or more DAC segments in response to the dump code.

8. The method of claim 5, wherein the step of powering off the second portion of the two or more DAC segments comprises applying a step input to the first portion of the two or more DAC segments, wherein the step input is opposite of a calibrated offset of the second portion of the two or more DAC segments.

9. The method of claim 5, further comprising calibrating the second portion of the two or more DAC segments after the second portion is powered off.

10. The method of claim 9, further comprising:
    powering on the second portion of the two or more DAC segments;
    after powering on the second portion of the two or more DAC segments, determining a third portion of the two or more DAC segments sufficient to generate the output signal based, at least in part, on a second envelope of the buffered input signal;
    after determining the third portion, powering off a fourth portion of the two or more DAC segments; and
    after powering off the fourth portion of the two or more DAC segments, calibrating the fourth portion of the two or more DAC segments, wherein the fourth portion is different from the second portion.

11. The method of claim 1, wherein the step of powering off the second portion of the two or more DAC segments comprises providing a zero code to the second portion of the two or more DAC segments.

12. The method of claim 11, wherein the step of powering off the second portion of the two or more DAC segments comprises:
    modulating switch elements of the second portion of the two or more DAC segments between ground and an output node in response to the zero code; and
    disconnecting a power supply from the switch elements.

13. The method of claim 1, wherein the step of powering off the second portion of the two or more DAC segments comprises powering off a plurality of cascade switch within the second portion of the two or more DAC segments.

14. The method of claim 1, wherein the step of powering off the second portion of the two or more DAC segments comprises switch off a plurality of mirror switches within the second portion of the two or more DAC segments.

15. The method of claim 1, wherein the buffered input signal comprises a high fidelity audio signal.

16. A finite impulse response (FIR) digital-to-analog converter (DAC), comprising:
    two or more DAC segments;
    a buffer coupled to the input node, wherein the buffer is configured to buffer an input signal to obtain a buffered input signal;
    a controller coupled to the two or more DAC segments and configured to perform steps comprising:
        determining a first portion of the two or more DAC segments sufficient to generate an output signal based, at least in part, on an envelope of the buffered input signal; and powering off a second portion of the two or more DAC segments not in the first portion of the two or more DAC segments.

17. The apparatus of claim 16, wherein the controller is further configured to perform steps comprising:
   powering on the second portion of the two or more DAC segments; and
   repeating the steps of determining the first portion and powering off the second portion,
   wherein the repeating of the steps of determining the first portion and powering off the second portion dynamically controls a power output of the FIR DAC during playback of media.

18. The apparatus of claim 16, wherein the step of determining the first portion of the two or more DAC segments is based, at least in part, on a transient envelope of the buffered input signal.

19. The apparatus of claim 16, wherein the step of powering off the second portion of the two or more DAC segments comprises:
   powering off a first fraction of a plurality of elements within the second portion of the two or more DAC segments; and
   powering off a second fraction of the plurality of elements within the second portion of the two or more DAC segments after powering off the first fraction.

20. The apparatus of claim 16, wherein the step of powering off the second portion of the two or more DAC segments comprises providing a dump code to the second portion of the two or more DAC segments.

21. The apparatus of claim 20, wherein the step of powering off the second portion of the two or more DAC segments comprises:
   shunting output to ground from switch elements of the second portion of the two or more DAC segments in response to the dump code; and
   disconnecting a power supply from the switch elements shunted to ground.

22. The apparatus of claim 21, wherein the step of powering down the second portion of the two or more DAC segments comprises:
   reducing a clock rate of at least some switch elements of the second portion of the two or more DAC segments in response to the dump code.

23. The apparatus of claim 20, wherein the step of powering off the second portion of the two or more DAC segments comprises applying a step input to the first portion of the two or more DAC segments, wherein the step input is opposite of a calibrated offset of the second portion of the two or more DAC segments.

24. The apparatus of claim 20, wherein the controller is configured to perform steps comprising calibrating the second portion of the two or more DAC segments after the second portion is powered off.

25. The apparatus of claim 24, wherein the controller is further configured to perform steps comprising:
   powering on the second portion of the two or more DAC segments;
   after powering on the second portion of the two or more DAC segments, determining a third portion of the two or more DAC segments sufficient to generate the output signal based, at least in part, on a second envelope of the buffered input signal;
   after determining the third portion, powering off a fourth portion of the two or more DAC segments; and
   after powering off the fourth portion of the two or more DAC segments, calibrating the fourth portion of the two or more DAC segments, wherein the fourth portion is different from the second portion.

26. The apparatus of claim 16, wherein the step of powering off the second portion of the two or more DAC segments comprises providing a zero code to the second portion of the two or more DAC segments.

27. The apparatus of claim 26, wherein the step of powering off the second portion of the two or more DAC segments comprises:
   modulating switch elements of the second portion of the two or more DAC segments between ground and an output node in response to the zero code; and
   disconnecting a power supply from the switch elements.

28. The apparatus of claim 16, wherein the step of powering off the second portion of the two or more DAC segments comprises powering off a plurality of cascade switch within the second portion of the two or more DAC segments.

29. The apparatus of claim 16, wherein the step of powering off the second portion of the two or more DAC segments comprises switch off a plurality of mirror switches within the second portion of the two or more DAC segments.

30. The apparatus of claim 16, wherein the buffered input signal comprises a high fidelity audio signal.

* * * * *

UNITED STATES PATENT AND TRADEMARK OFFICE
CERTIFICATE OF CORRECTION

PATENT NO.         : 10,680,640 B2                                              Page 1 of 1
APPLICATION NO.    : 15/386213
DATED              : June 9, 2020
INVENTOR(S)        : Peterson et al.

It is certified that error appears in the above-identified patent and that said Letters Patent is hereby corrected as shown below:

On the Title Page

Item (72), Line 3, add -- John Melanson, Austin, TX (US) --

Signed and Sealed this
Tenth Day of November, 2020

Andrei Iancu
*Director of the United States Patent and Trademark Office*